(12) United States Patent
Silberberg et al.

(10) Patent No.: US 12,091,744 B2
(45) Date of Patent: Sep. 17, 2024

(54) VACUUM DEPOSITION FACILITY AND METHOD FOR COATING A SUBSTRATE

(71) Applicant: ARCELORMITTAL, Luxembourg (LU)

(72) Inventors: Eric Silberberg, Haltinne (BE); Thiago Rabelo Nunes Campos, Vigy (FR); Negar Gilani, Metz (FR)

(73) Assignee: ArcelorMittal, Luxembourg (LU)

( * ) Notice: Subject to any disclaimer, the term of this patent is extended or adjusted under 35 U.S.C. 154(b) by 816 days.

(21) Appl. No.: 16/973,114

(22) PCT Filed: Apr. 23, 2019

(86) PCT No.: PCT/IB2019/053341
§ 371 (c)(1),
(2) Date: Dec. 8, 2020

(87) PCT Pub. No.: WO2019/239229
PCT Pub. Date: Dec. 19, 2019

(65) Prior Publication Data
US 2021/0238735 A1    Aug. 5, 2021

(30) Foreign Application Priority Data

Jun. 13, 2018 (WO) .................. PCT/IB2018/054302

(51) Int. Cl.
| | |
|---|---|
| *C23C 14/16* | (2006.01) |
| *C23C 14/04* | (2006.01) |
| *C23C 14/24* | (2006.01) |
| *C23C 14/56* | (2006.01) |

(52) U.S. Cl.
CPC ............ *C23C 14/562* (2013.01); *C23C 14/04* (2013.01); *C23C 14/16* (2013.01); *C23C 14/24* (2013.01)

(58) Field of Classification Search
CPC ....... C23C 14/562; C23C 14/04; C23C 14/16; C23C 14/24
See application file for complete search history.

(56) References Cited

U.S. PATENT DOCUMENTS

| | | |
|---|---|---|
| 4,960,607 A | 10/1990 | Neuman et al. |
| 5,608,083 A | 3/1997 | Fuderer |
| 5,803,976 A | 9/1998 | Baxter et al. |
| 6,202,591 B1 | 3/2001 | Witzman et al. |

(Continued)

FOREIGN PATENT DOCUMENTS

| | | |
|---|---|---|
| CA | 2316669 A1 | 2/2001 |
| CN | 87105737 A | 5/1988 |

(Continued)

OTHER PUBLICATIONS

[NPL-1] Collin (WO 97/47782 A1), Dec. 18, 1997 (EPO machine translation to English). (Year: 1997).*

(Continued)

*Primary Examiner* — Dah-Wei D. Yuan
*Assistant Examiner* — Kristen A Dagenais
(74) *Attorney, Agent, or Firm* — Davidson Kappel LLC

(57) ABSTRACT

A method for continuously depositing, on a running substrate, coatings formed from at least one metal inside a Vacuum deposition facility including a vacuum chamber, a coated substrate coated with at least one metal on both sides of the substrate and a vacuum deposition facility.

16 Claims, 5 Drawing Sheets

(56) References Cited

U.S. PATENT DOCUMENTS

| | | | |
|---|---|---|---|
| 6,471,798 | B1 | 10/2002 | Oishi et al. |
| 8,481,120 | B2 | 7/2013 | Choquet et al. |
| 9,045,819 | B2 | 6/2015 | Honda et al. |
| 2004/0022942 | A1 | 2/2004 | Schade van Westrum et al. |
| 2004/0154539 | A1 | 8/2004 | Feldbauer et al. |
| 2007/0128344 | A1 | 6/2007 | Marriott et al. |
| 2008/0245300 | A1 | 10/2008 | Kuper et al. |
| 2010/0104752 | A1 | 4/2010 | Choquet et al. |
| 2011/0000431 | A1 | 1/2011 | Banaszak et al. |
| 2011/0081486 | A1* | 4/2011 | McCamy .......... C23C 16/45578 427/255.19 |
| 2011/0281031 | A1* | 11/2011 | Silberberg ............. C23C 14/24 427/255.395 |
| 2012/0070928 | A1 | 3/2012 | Kim et al. |
| 2017/0114427 | A1 | 4/2017 | Li et al. |
| 2021/0254190 | A1 | 8/2021 | Bansal et al. |
| 2021/0254205 | A1 | 8/2021 | Silberberg et al. |

FOREIGN PATENT DOCUMENTS

| | | | | |
|---|---|---|---|---|
| CN | 1458985 | A | 11/2003 | |
| CN | 1875128 | | 12/2006 | |
| CN | 203823748 | U | 9/2014 | |
| CN | 107723663 | A | 2/2018 | |
| DE | 102010040044 | A1 | 3/2012 | |
| DE | 10 2013206598 | A1 | 10/2014 | |
| EP | 0262324 | A1 | 4/1988 | |
| EP | 0410501 | A1 | 1/1991 | |
| EP | 0909342 | B1 | 8/2004 | |
| EP | 1 972 699 | A1 | 9/2008 | |
| EP | 2048261 | | 4/2009 | |
| EP | 2129811 | B1 | 8/2013 | |
| EP | 2940191 | | 11/2015 | |
| EP | 3369839 | B1 | 10/2020 | |
| JP | S5240413 | A | 3/1977 | |
| JP | S61284565 | A | 12/1986 | |
| JP | S 6296669 | A | 5/1987 | |
| JP | S62151528 | A | 7/1987 | |
| JP | S62230932 | A | 10/1987 | |
| JP | S6326351 | | 2/1988 | |
| JP | S63100124 | A | 5/1988 | |
| JP | S63105920 | A | 5/1988 | |
| JP | H01233049 | A | 9/1989 | |
| JP | H 0204963 | A | 1/1990 | |
| JP | H04160159 | A | 6/1992 | |
| JP | 06136537 | A * | 5/1994 | |
| JP | H06136537 | A | 5/1994 | |
| JP | H06212424 | A | 8/1994 | |
| JP | 2004311065 | A | 11/2004 | |
| JP | 2007262540 | | 10/2007 | |
| JP | 2010522272 | A | 7/2010 | |
| JP | 2011503344 | A | 1/2011 | |
| JP | 2012512959 | A | 6/2012 | |
| JP | 2013-506761 | A | 2/2013 | |
| JP | 2014132102 | A | 7/2014 | |
| JP | 2018031076 | A | 3/2018 | |
| KR | 0180725 | B1 | 2/1999 | |
| WO | WO8102585 | A | 9/1981 | |
| WO | WO97/47782 | | 12/1997 | |
| WO | WO-9747782 | A1 * | 12/1997 | ............ C23C 14/24 |
| WO | WO2005042797 | A1 | 5/2005 | |
| WO | WO2008/064894 | | 8/2008 | |
| WO | WO2010067603 | A1 | 6/2010 | |
| WO | WO2017073894 | A1 | 5/2017 | |
| WO | WO 2019/239227 | A1 | 12/2019 | |
| WO | WO20190239228 | A1 | 12/2019 | |

OTHER PUBLICATIONS

[NPL-2] Matsuda et al. (JP H06-136537 A), May 17, 1994 (EPO machine translation to English). (Year: 1994).*
Fluidized-bed Quenching, Gao, Weimin, Kong, Lingxue, Hodgson, Peter, ASM Handbook Steel Heat Treating, ASM International, (2013), vol. 4A, pp. 238-244 (Year: 2013).
International Search Report of PCT/IB2019/053341, dated Aug. 26, 2019.

* cited by examiner

VACUUM DEPOSITION FACILITY AND METHOD FOR COATING A SUBSTRATE

The present invention relates to a method for continuously depositing, on a substrate, coatings formed from metal or metal alloys. The present invention also relates to a vacuum deposition facility used in this method.

BACKGROUND

Various processes for depositing metal coatings, eventually composed of alloys, on a substrate, such as a steel strip, are known. Among these, mention may be made of hot-dip coating, electrodeposition and also the various vacuum deposition processes, such as vacuum evaporation and magnetron sputtering.

It is known from WO97/47782 a method for the continuous coating of a steel substrate in which a metallic vapor spray, propelled at a speed greater than 500 m/s, comes in contact with the substrate. The deposition method is called jet vapor deposition.

EP2940191 discloses a method of manufacturing a Zn—Mg alloy-plated steel sheet, comprising: preparing a base steel sheet; and forming a Zn—Mg plating layer by evaporating a Zn—Mg alloy source to be deposited on a surface of the base steel sheet, wherein an Mg content of the Zn—Mg plating layer is 8 wt % or less (but above 0 wt %) and a temperature of the base steel sheet before and after the Zn—Mg plating layer is deposited thereon is 60° C. or lower.

In this patent application, it is mentioned that in order to adjust temperature of the base steel sheet, a method of cooling the base steel sheet before and after a deposition process is performed, by installing cooling rolls. When it comes to cooling devices, in order to obtain good cooling efficiency in a vacuum state, a plurality of cooling rolls may be installed, rather than a single cooling roll, to significantly increase an interface thereof. In particular, a rise in the temperature of the steel sheet may be significant after a coating process due to coating condensation enthalpy. Thus, after the coating process, increasing cooling efficiency and managing the temperature of the cooling rolls to be relatively low by increasing the number or size of the cooling rolls may be desirable.

SUMMARY OF THE INVENTION

Nevertheless, by using several cooling rolls, there is a risk that the temperature of the base steel sheet is not homogenous enough leading to flatness issues due to cooling heterogeneity. Indeed, when the metallic vapor is condensed on the substrate, heat energy is released leading to the elastic deformation of the substrate. The elastic deformation can lead to flatness issues after the cooling rolls since the contact pressure between the coated metallic substrate and the cooling rolls is not homogenous. Consequently, there is a risk that the plurality of cooling rolls used in EP2940191 deforms the steel since the interface between the coated steel sheet and the cooling rolls has significantly increased.

In the case where the coating is deposited on both sides of a metallic substrate, it is also important to control the temperature of the metallic substrate. Indeed, when the flatness of the coated metallic substrate is improved, the quality of the coated metallic substrate increases including, for example, the homogeneity of its mechanical properties, the surface aspect of the coating.

It is an object of the present invention to provide an optimized method for depositing coatings on both sides of a running substrate so that the flatness of the coated metallic substrate is highly improved.

It is an object of the present invention to provide a method for continuously depositing, on a running substrate (S), coatings formed from at least one metal inside a Vacuum deposition facility (1) comprising a vacuum chamber (2), wherein the method comprises:

A step in which in the said vacuum chamber, a metallic vapor is ejected through at least two vapor ejectors (3, 3'), towards both sides of the running substrate and a layer of at least one metal is formed on each side by condensation of ejected vapors, the at least two vapor ejectors facing each other being positioned respectively with an angle α and α', being between the vapor ejector and the axis (A) perpendicular to the running direction of the substrate, the axis being in the plane of the substrate, α and α' both satisfying the following equations:

$$\alpha = \arccos\left(\frac{Ws - (D1 + D2)}{We}\right) \text{ with } 0° < \alpha < 82° \text{ and}$$

$$\alpha' = \arccos\left(\frac{Ws - (D1 + D2)}{We}\right) \text{ with } 0° < \alpha' < 82°,$$

D1 and D2 being the distance between ejectors and each substrate edge along the axis (A), $W_s$ being the substrate width, said vapor ejectors having an elongated shape and comprising a slot and being defined by a slot width We, said vapor ejectors having the same rotation axis.

The invention also covers a coated substrate.
The invention also covers a vacuum facility.

BRIEF DESCRIPTION OF THE DRAWINGS

To illustrate the invention, various embodiments and trials of non-limiting examples will be described, particularly with reference to the following Figure.

DETAILED DESCRIPTION

Other characteristics and advantages of the invention will become apparent from the following detailed description of the invention.

The invention relates to a Method for continuously depositing, on a running substrate S, coatings formed from at least one metal inside a Vacuum deposition facility comprising a vacuum chamber, wherein the method comprises:

A step in which in the said vacuum chamber, a metallic vapor is ejected through at least two vapor ejectors, towards both sides of the running substrate and a layer of at least one metal is formed on each side by condensation of ejected vapors, the at least two vapor ejectors facing each other being positioned respectively with an angle $\alpha$ and $\alpha'$, being between the vapor ejector and the axis A perpendicular to the running direction of the substrate, the axis being in the plane of the substrate, $\alpha$ and $\alpha'$ both satisfying the following equation:

$$\alpha = \arccos\left(\frac{Ws - (D1 + D2)}{We}\right) \text{ with } 0° < \alpha < 82° \text{ and}$$

$$\alpha' = \arccos\left(\frac{Ws - (D1 + D2)}{We}\right) \text{ with } 0° < \alpha' < 82°,$$

D1 and D2 being the distance between ejectors and each substrate edge along the axis (A), $W_s$ being the substrate width, said vapor ejectors having an elongated shape and comprising a slot and being defined by a slot width We, said vapor ejectors having the same rotation axis.

Without willing to be bound by any theory, it is believed that with the method according to the present invention, it is possible to obtain a flat coated metallic substrate. Indeed, the inventors have found that the two vapors ejectors have to be positioned with a specific angle, the two ejectors facing each other so that during the metal deposition, the temperature distribution through the substrate width is symmetrical during the metal deposition. The thermal profile along the substrate width is uniform. Thus, the elastic deformation profile along the substrate after Zn deposition is symmetrical leading to a uniform contact pressure between the substrate and the first cooling roll. Consequently, the coated substrate remains flat.

Figure 1:
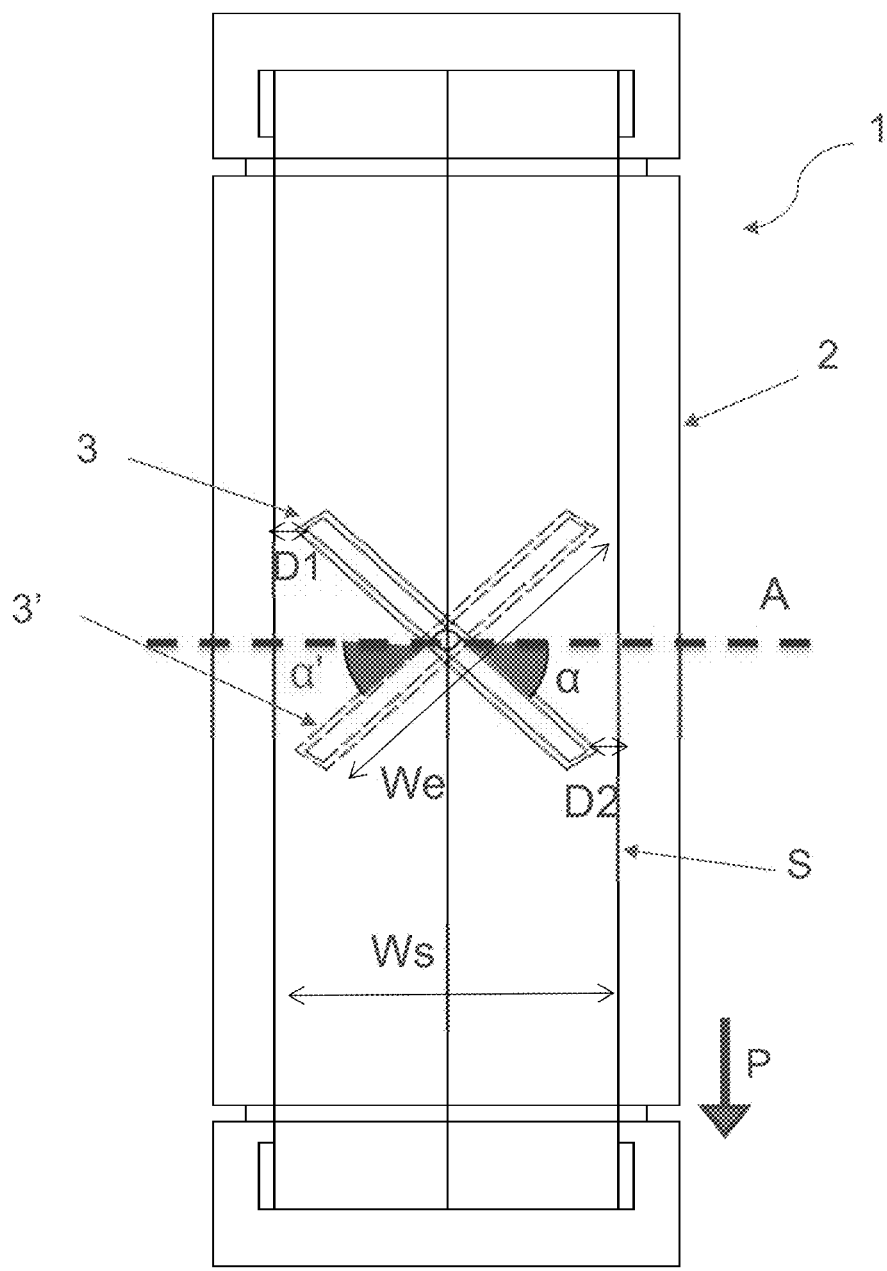
FIG. 1 illustrates a top view of a substrate coated with two vapor ejectors inside a vacuum deposition facility according to the present invention.

With reference to FIG. 1, the facility 1 according to the invention first comprises a vacuum chamber 2 and a means for running the substrate through the chamber. This vacuum chamber 2 is a hermetically-sealable box preferably kept at a pressure of between $10^{-8}$ and $10^{-3}$ bar. It has an entry lock and an exit lock (these not being shown) between which a substrate S, such as for example a steel strip, can run along a given path P in a running direction.

The at least two vapor ejectors 3, 3' eject metallic vapors at sonic speed on both sides of the running substrate. Both vapor ejectors are positioned respectively with an angle $\alpha$ and $\alpha'$ between the vapor ejector and the axis A perpendicular to the running direction of the substrate, the axis being in the plane of the substrate, $\alpha$ and $\alpha'$ both satisfying the following equation:

$$\alpha = \arccos\left(\frac{Ws - (D1 + D2)}{We}\right) \text{ with } 0° < \alpha < 82° \text{ and}$$

$$\alpha' = \arccos\left(\frac{Ws - (D1 + D2)}{We}\right) \text{ with } 0° < \alpha' < 82°,$$

The ejectors can have different shapes, such as a rectangular shape or a trapezoidal shape. Different distances values of D1 and D2 are possible as illustrated in FIG. 1. Preferably, D1 and D2 represent the lowest distance between the ejector edges and the substrate edges along the axis A.

Figure 2:
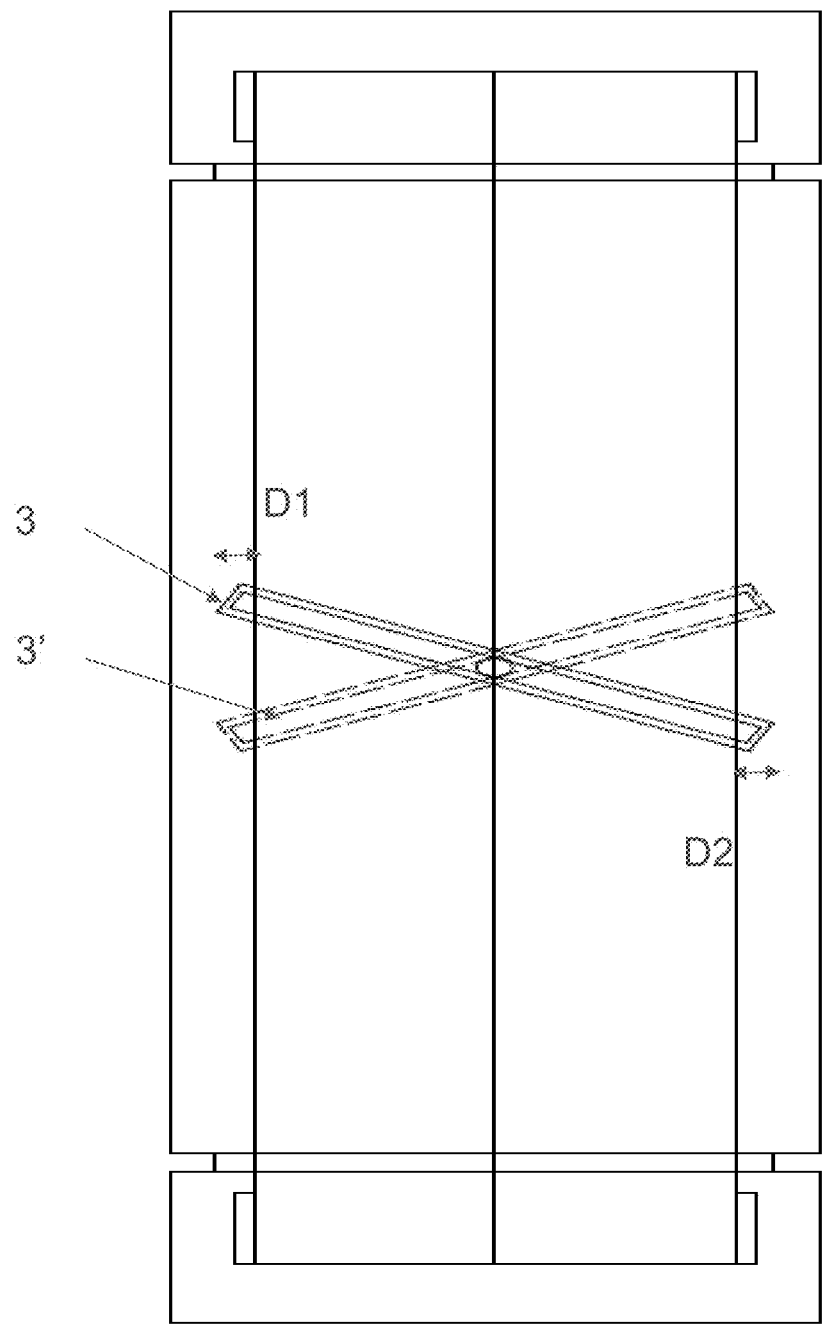
FIG. 2 illustrates a top view of another example of a substrate coated with two vapor ejector inside a vacuum deposition facility according to the present invention.

Preferably, D1 and D2 can be below, equal or above 0 mm. In case D1 and D2 are above 0 mm, the ejector edges do not go beyond the substrate edges. In the case D1 and D2 is below 0 mm, the ejector edges go beyond the substrate edges as illustrated in FIG. 2. In the case D1 and D2 are equal to 0 mm, the substrate edges are in the same plane than ejector's edges. Preferably, D1 and D2 are above or below 0 mm.

Preferably, D1 and D2 are independently from each other above 1 mm, advantageously between 5 and 100 mm and more preferably between 30 and 70 mm. In a preferred embodiment, D1 is identical to D2.

Preferably, the substrate width Ws is maximum of 2200 mm. Advantageously, Ws is minimum of 200 mm. For example, Ws is between 1000 and 2000 mm.

Preferably, We is maximum of 2400 mm. Advantageously, We is minimum of 400 mm.

In a preferred embodiment, Ws is smaller or equal to We.

Preferably, $\alpha'$ is such that $\alpha-\alpha'<10°$, more preferably $\alpha-\alpha'<5°$ and advantageously, $\alpha-\alpha'<3°$ in absolute terms. For example, $\alpha-\alpha'$ are equal to 0°.

Preferably, $\alpha$ is between 0 and 60°, advantageously between 10 and 50° in absolute terms and for example between 20 and 35° in absolute terms.

The vacuum chamber can comprise three or several vapor ejectors positioned on both sides of the running substrate. For example, the vacuum chamber can comprise two vapor ejectors positioned on each side of the metallic substrate.

Figure 3:
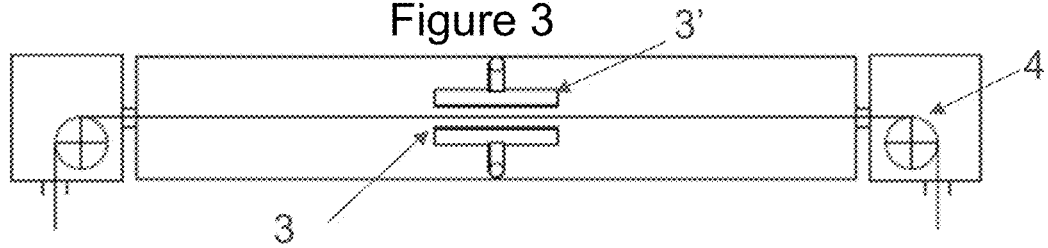
FIG. 3 illustrates a side view of a substrate coated with at least one metal inside a vacuum deposition facility according to the present invention.

As illustrated in FIG. 3, the substrate S may be made to run by any suitable means, depending on the nature and the shape of said substrate. A rotary support roller 4 on which a steel strip can bear may in particular be used.

Figure 4:
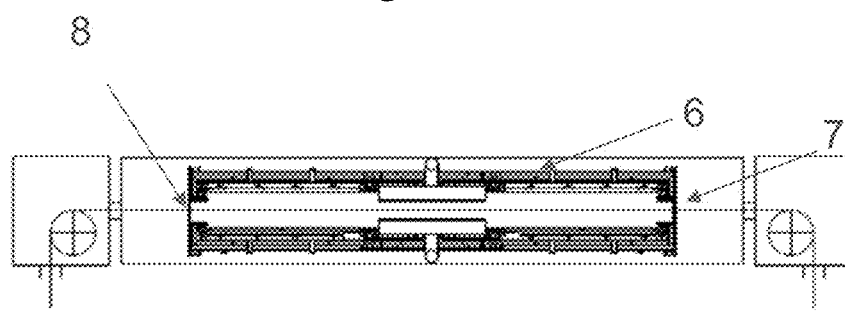
FIG. 4 illustrates a side view of a substrate coated with at least one metal inside a vacuum deposition facility according to the preferred embodiment.

As illustrated in FIG. 4, the vacuum chamber 2 can further comprise a central casing 6. This is a box surrounding the substrate path P on a given length in the running direction, typically 2 to 8 m long in the case of one ejector per side. Its walls delimit a cavity. It comprises two apertures, i.e. a substrate entry 7 and a substrate exit 8 located on two opposite sides of the central casing. Preferably the central casing is a parallelepiped which width is slightly larger than the substrates to be coated.

Preferably, the inner walls of the central casing are suited to be heated at a temperature above the condensation temperature of the metal or metal alloy vapors. The heating may be made by any suitable means, such as for example an induction heater, heating resistors, electron beam. The heating means are suited to heat the inner walls of the central casing at a temperature high enough to avoid condensation of metal or metal alloy vapors on them. Preferably, the walls of the central casing are suited to be heated above the condensation temperatures of the metal elements forming the coating to be deposited, typically above 500° C., for example between 500° C. and 700° C. so as to avoid the condensation of zinc vapors or zinc-magnesium alloy vapors. Thanks to these heating means, the inner walls of the central casing do not become clogged and the facility does not have to be frequently stopped for cleaning. Moreover, the condensation of metal or metal alloys vapors on the inner walls is avoided.

Figure 5A:
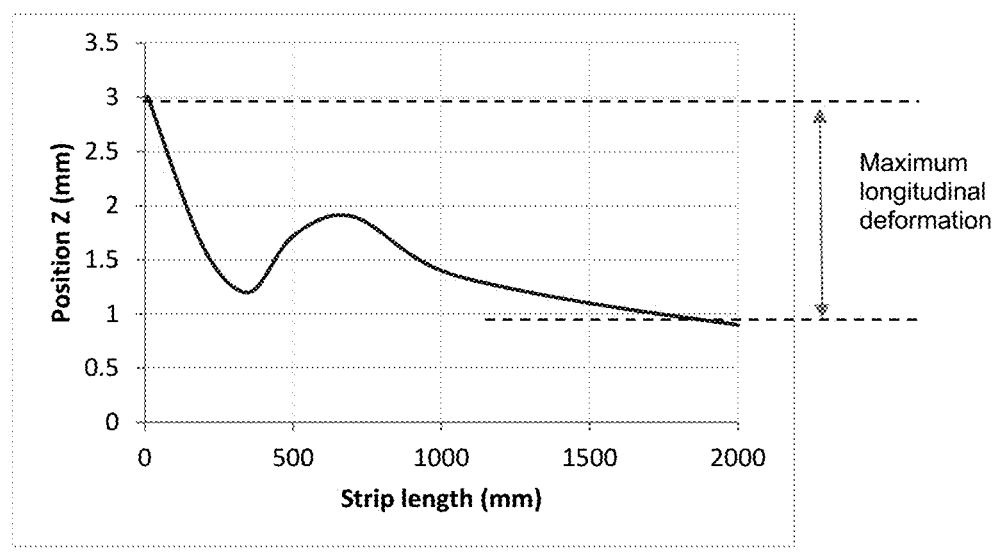
FIGS. 5a and 5b illustrate the maximum deformation as defined in the present invention.
Figure 5B:
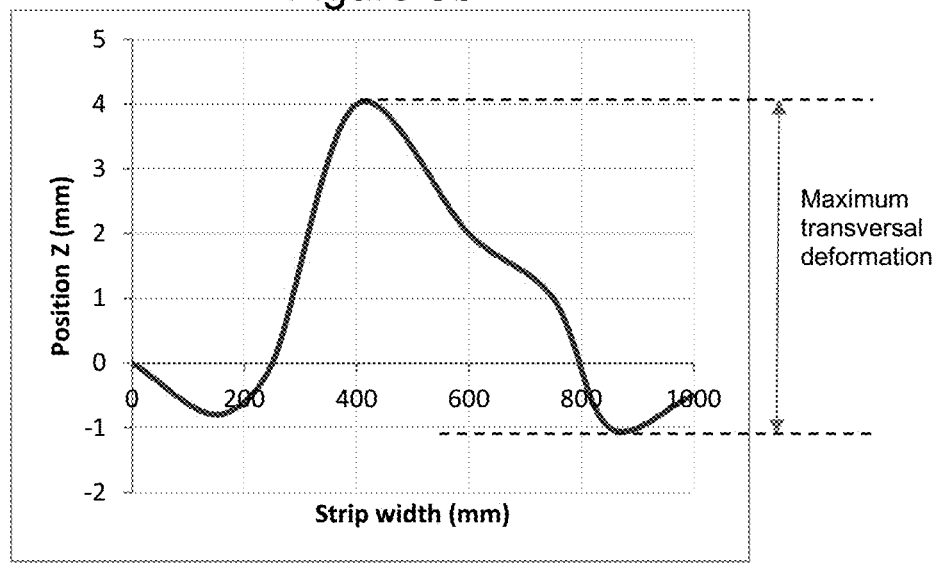

In particular, with the method according to the present invention, it is possible to obtain a metallic substrate coated with at least one metal on both sides of the substrate, the substrate being such that the maximum longitudinal deformation is below 2 mm and the maximum transversal deformation is below 5 mm. As illustrated in FIG. 5a, the maximum longitudinal deformation represents the difference between the height of the peak maximum and the minimum peak height along the length of the coated substrate. As illustrated in FIG. 5b, the maximum transversal deformation represents the difference between the height of the peak maximum and the minimum peak height along the width of the coated substrate.

In the present invention, the at least one metal is preferably chosen among: zinc, chromium, nickel, titanium, manganese, magnesium, silicon, aluminum or a mixture thereof. Preferably, the metal is zinc with optionally magnesium.

Preferably, the metallic substrate is a steel substrate. Indeed, without willing to be bound by any theory, it is believed that the flatness is further improved when using steel substrate.

The thickness of the coating will preferably be between 0.1 and 20 µm. On one hand, below 0.1 µm, there would be a risk that the corrosion protection of the substrate would be insufficient. On the other hand, it is unnecessary to go beyond 20 µm in order to have the level of corrosion resistance which is required, in particular, in the automotive or construction field. In general, the thickness may be limited to 10 µm for automotive applications.

Finally, the invention relates to a Vacuum deposition facility for the method according to the present invention for continuously depositing, on a running substrate S, coatings formed from at least one metal, the facility 1 comprising a vacuum chamber 2 through which the substrate 3 can run along a given path, wherein the vacuum chamber comprises:
the at least two vapor ejectors facing each other being positioned respectively with an angle α and α', being between the vapor ejector and the axis A) perpendicular to the running direction of the substrate, the axis being in the plane of the substrate, α and α' both satisfying the following equation:

$$\alpha = \arccos\left(\frac{Ws - (D1 + D2)}{We}\right) \text{ with } 0° < \alpha < 82° \text{ and}$$

$$\alpha' = \arccos\left(\frac{Ws - (D1 + D2)}{We}\right) \text{ with } 0° < \alpha' < 82°,$$

D1 and D2 being the distance between the ejector and the substrate edge along the axis (A), $W_s$ being the substrate width, said vapor ejectors having an elongated shape and comprising a slot and being defined by a slot width We, said vapor ejectors having the same rotation axis.

In a preferred embodiment, the at least two vapor ejectors are mounted to be able to rotate around a feeding pipe linked to a vapor source so that α and α' are adjusted.

Examples

Modeling tests have been performed on the vacuum deposition facility to assess the efficiency of the method comprising two vapor ejectors ejecting zinc vapor.

For all trials, different positions and angles α and α' were tested to determine the efficiency of the method according to the present invention.

For all the trials, the steel substrate width Ws varied from 1000 to 1710 mm in the vacuum chamber comprising two vapor ejectors having We=1710 mm. D1 and D2 were identical and equal to 0 mm. The vacuum pressure was of $10^{-1}$ mBar.

The flatness was defined by the coated substrate peak having the maximum deformation after the first cooling roll. The results are in the following

TABLE 1

Figure 6A:
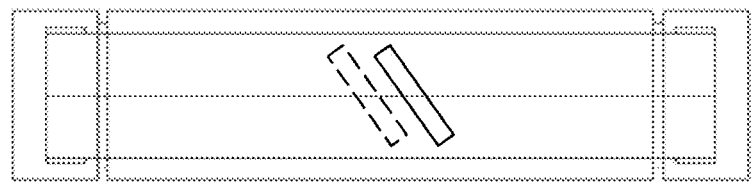
FIGS. 6a to 6c illustrate top view of a substrate coated with two ejectors vapors having different positions inside a vacuum deposition facility.
Figure 6B:
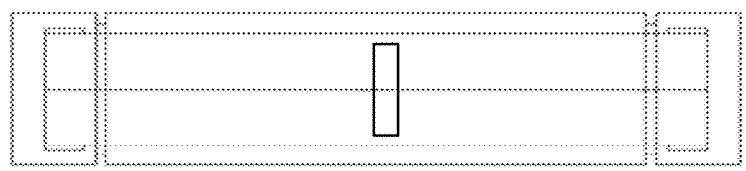
Figure 6C:
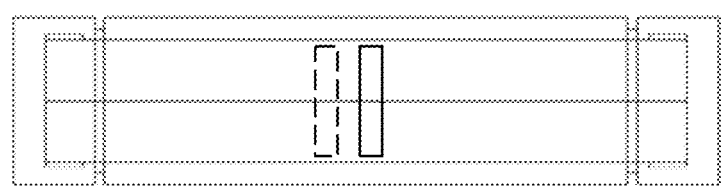

| Trials | Ws (mm) | Vapor ejectors configuration | α and α' (degrees) | α Satisfies the equation | Maximum transversal deformation (mm) | Maximum longitudinal deformation (mm) |
|---|---|---|---|---|---|---|
| 1* | 1000 | Crossed, centered, facing each other (FIG. 1) | 54 | Yes | 0 | 0 |
| 2 | 1000 | Inclined, parallels, not facing each other (FIG. 6a) | 54 | Yes | 12 | 22 |
| 3* | 1710 | Facing each other, horizontal and parallels (FIG. 6b) | 0 | yes | 1.5 | 0.6 |
| 4 | 1710 | Not facing each other, parallels and horizontal (FIG. 6c) | 0 | Yes | 5.5 | 2 |

*according to the present invention

The Trials according to the present invention have no or almost no deformation compared to the comparative example. Therefore, the flatness is higher with the method according to the present invention.

What is claimed is:

1. A method for continuously depositing, on a running substrate, coatings formed from at least one metal inside a vacuum deposition facility including a vacuum chamber, the method comprising the steps of:
ejecting, in the vacuum chamber, a metallic vapor through at least two vapor ejectors, towards both sides of the running substrate, a layer of at least one metal being formed on each side by condensation of ejected vapors, the at least two vapor ejectors facing each other being positioned respectively with an angle α and α' between the vapor ejector and an axis perpendicular to a running direction of the substrate, the axis being in the plane of the substrate, α and α' both satisfying the following equations:

$$\alpha = \arccos\left(\frac{Ws - (D1 + D2)}{We}\right) \text{ with } 0° < \alpha < 82° \text{ and}$$

-continued
$$\alpha' = \arccos\left(\frac{Ws - (D1 + D2)}{We}\right) \text{ with } 0° < \alpha' < 82°,$$

D1 and D2 being the distance between the ejectors and each substrate edge along the axis, $W_s$ being the substrate width, the vapor ejectors having an elongated shape and including a slot defined by a slot width We, the vapor ejectors having a same rotation axis.

2. The method as recited in claim 1 wherein the distance between the ejector and the substrate edges D1 and D2 are above 0 mm so ejector edges do not go beyond the substrate edges.

3. The method as recited in claim 1 wherein D1 and D2 are equal to 0 mm so the substrate edges are in a same plane as ejector edges.

4. The method as recited in claim 1 wherein D1 and D2 are below 0 mm so ejector edges extend beyond the substrate edges.

5. The method as recited in claim 1 wherein the substrate width Ws is maximum of 2200 mm.

6. The method as recited in claim 1 wherein Ws is minimum of 200 mm.

7. The method as recited in claim 1 wherein α' is such that α-α'<10° in absolute terms.

8. The method as recited in claim 7 wherein α is between 0 and 60° in absolute terms.

9. The method as recited in claim 8 wherein α is between 10 and 50° in absolute terms.

10. The method as recited in claim 9 wherein α is between 20 and 350 in absolute terms.

11. The method as recited in claim 1 wherein the ejectors have a rectangular shape or a trapezoidal shape.

12. The method as recited in claim 1 wherein D1 is identical to D2.

13. The method as recited in claim 1 wherein the vacuum chamber further comprises a central casing surrounding the substrate, the central casing including a substrate entry and a substrate exit located on two opposite sides of the central casing and the at the least two vapor ejectors.

14. The method as recited in claim 13 wherein inner walls of the central casing are suited to be heated at a temperature above a condensation temperature of the metal or metal alloy vapors.

15. The method as recited in claim 1, wherein the at least two vapor ejectors eject metallic vapors at sonic speed on both sides of the running substrate.

16. The method as recited in claim 2, wherein the at least two vapor ejectors eject metallic vapors at sonic speed on both sides of the running substrate.

* * * * *